(12) United States Patent
Ngo et al.

(10) Patent No.: US 8,791,624 B2
(45) Date of Patent: Jul. 29, 2014

(54) ACOUSTIC GALVANIC ISOLATION DEVICE

(75) Inventors: Sophie Ngo, Tours (FR); Edgard Jeanne, Saint Cyr sur Loire (FR); Daniel Alquier, Tours (FR)

(73) Assignees: STMicroelectronics (Tours) SAS, Tours (FR); Universite Francois Rabelais, Tours (FR)

( * ) Notice: Subject to any disclaimer, the term of this patent is extended or adjusted under 35 U.S.C. 154(b) by 242 days.

(21) Appl. No.: 13/237,713

(22) Filed: Sep. 20, 2011

(65) Prior Publication Data

US 2012/0086305 A1 Apr. 12, 2012

(30) Foreign Application Priority Data

Oct. 12, 2010 (FR) ...................................... 10 58294

(51) Int. Cl.
*H02N 1/00* (2006.01)
(52) U.S. Cl.
USPC ............................ 310/334; 367/181; 367/180
(58) Field of Classification Search
CPC ....... B06B 1/0622; G10K 11/02; H04R 17/00
USPC ............................ 310/344, 334; 367/181, 180
See application file for complete search history.

(56) References Cited

U.S. PATENT DOCUMENTS

| 6,314,057 | B1* | 11/2001 | Solomon et al. | 367/174 |
|---|---|---|---|---|
| 7,489,593 | B2* | 2/2009 | Nguyen-Dinh et al. | 367/181 |
| 7,622,855 | B2* | 11/2009 | Seto | 310/369 |
| 7,952,256 | B2* | 5/2011 | Matsumoto et al. | 310/309 |
| 2005/0162040 | A1* | 7/2005 | Robert | 310/322 |
| 2007/0086080 | A1 | 4/2007 | Larson, II et al. | |
| 2007/0086274 | A1* | 4/2007 | Nishimura et al. | 367/140 |
| 2008/0184549 | A1* | 8/2008 | Nguyen-Dinh et al. | 29/594 |

FOREIGN PATENT DOCUMENTS

| DE | 10 2005 037 429 | 2/2007 |
|---|---|---|
| WO | WO 2009/073748 | 6/2009 |

OTHER PUBLICATIONS

French Search Report dated May 31, 2011 from corresponding French Application No. 10/58294.
Written Opinion dated May 31, 2011 from corresponding French Application No. 10/58294.

* cited by examiner

*Primary Examiner* — Derek Rosenau
*Assistant Examiner* — Bryan Gordon
(74) *Attorney, Agent, or Firm* — Wolf, Greenfield & Sacks, P.C.

(57) ABSTRACT

An electroacoustic transducer including a first electrode formed on a substrate capable of transmitting ultrasounds, a membrane formed above the first electrode and separated therefrom by a cavity, a second electrode formed on the membrane, a first insulating layer on the second electrode, and a third electrode formed on the first insulating layer.

34 Claims, 2 Drawing Sheets

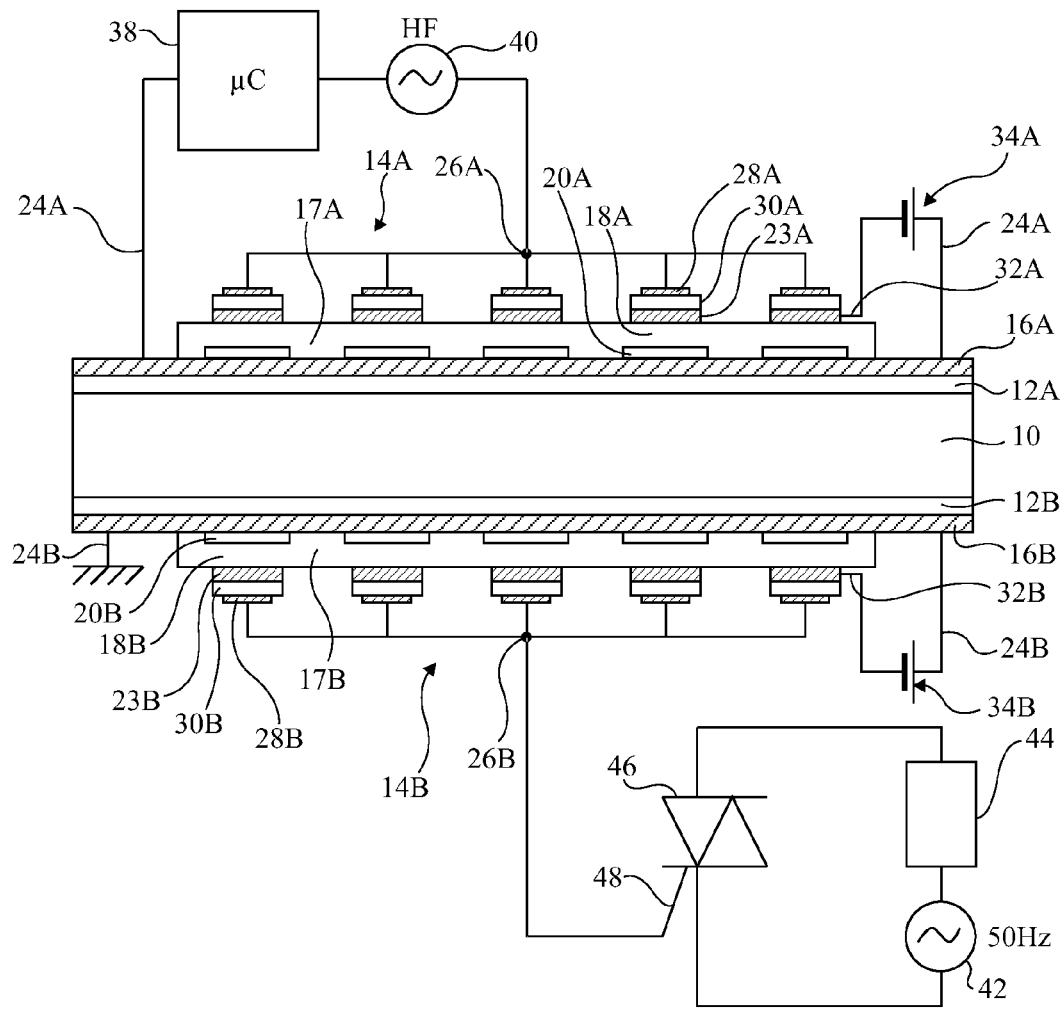
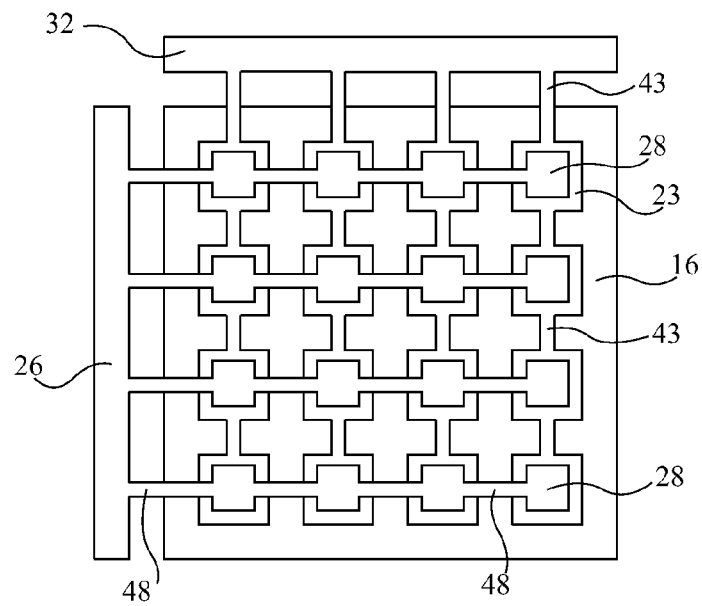
Fig 2
Fig 3

ACOUSTIC GALVANIC ISOLATION DEVICE

CROSS REFERENCE TO RELATED APPLICATIONS

This application claims the priority benefit of French patent application number 10/58294, filed on Oct. 12, 2010, entitled "ACOUSTIC GALVANIC ISOLATION DEVICE," which is hereby incorporated by reference to the maximum extent allowable by law.

BACKGROUND OF THE INVENTION

1. Field of the Invention

The present invention relates to electroacoustic transducers and to acoustic galvanic isolation devices.

2. Discussion of the Related Art

An electroacoustic transducer converts an A.C. electric signal into acoustic waves (transmission) or conversely (reception). By associating electroacoustic transducers respectively operating in transmit and in receive mode on either side of a substrate, a galvanic isolation can be achieved.

FIG. 1 illustrates a device of galvanic isolation by acoustic connection described in unpublished French patent application 09/58864 filed on Dec. 11, 2009.

This device comprises a substrate 10 made of any material capable of transmitting acoustic waves, for example, a glass or silicon wafer. As an example, on a first surface of a silicon substrate 10, a first layer 12A of a heavily-insulating material, for example, thermal silicon oxide or another thermal oxide, extends. On the first layer of insulating material 12A is formed of a first array 14A of ultrasonic transducers connected in parallel. These transducers comprise a conductive layer 16A formed on insulating layer 12A and forming a first electrode common to all transducers. Conductive layer 16A may be made of heavily-doped polysilicon or of a metal.

Above conductive layer 16A is formed a layer 17A of a dielectric material, for example, silicon nitride. Membranes 18A are defined in layer 17A above cavities 20A.

On membranes 18A and opposite to cavities 20A are formed second electrodes 22A. These electrodes may be made of aluminum.

One or several contacts 24A are formed on first electrode 16A. Electrodes 22A are connected to a node 26A.

Symmetrically, the second surface of substrate 10 comprises elements 12B, 14B, 16B, 17B, 18B, 20B, 22B, 24B and 26B homologous to elements 12A, 14A, 16A, 17A, 18A, 20A, 22A, 24A and 26A.

The device of FIG. 1 operates as follows. An A.C. input signal which is desired to be transmitted from the electroacoustic transducers of array 14A to the electroacoustic transducers of array 14B and a bias voltage are applied between contact 24A and 26A of first array 14A of transducers. The A.C. input voltage causes the oscillation of the different membranes 18A of the transducers of first array 14A.

Substrate 10 propagates the ultrasound acoustic waves created by the oscillation of membranes 18A towards second array 14B. Advantageously, in the case of a silicon substrate 10, the path of the acoustic waves is highly directional, which enables the waves to be well received at the level of second array 14B.

The acoustic waves transmitted by substrate 10 reach the second array of ultrasonic transducers 14B, which causes the vibration of membranes 18B. A D.C. voltage generator is placed between contact terminals 24B and 26B of the second array. The vibration of membranes 18B then causes a variation of the voltage across an electric output circuit connected to contact 26B.

Such an isolation may, for example, be used to isolate a control circuit referenced to ground from the control terminals of a power circuit referenced to a higher voltage, for example, the mains.

SUMMARY OF THE INVENTION

An embodiment provides an electroacoustic transducer comprising a first electrode formed on a substrate capable of transmitting ultrasounds, a membrane formed above the first electrode and separated therefrom by a cavity, a second electrode formed on the membrane, a first insulating layer on the second electrode, and a third electrode formed on the first insulating layer.

Another embodiment provides a galvanic isolation acoustic device.

Thus, an embodiment provides an electroacoustic transducer comprising a first electrode formed on a substrate capable of transmitting ultrasounds, a membrane formed above the first electrode and separated therefrom by a cavity, a second electrode formed on the membrane, a first insulating layer on the second electrode, and a third electrode formed on the first insulating layer.

According to an embodiment, the membrane and the insulating layer are made of silicon nitride.

According to an embodiment, the transducer comprises contacts capable of connecting a D.C. voltage generator between the first and second electrodes and an A.C. source between the first and third electrodes.

According to an embodiment, the substrate is a silicon wafer having a second insulating layer extending over at least one of its surfaces.

According to an embodiment, the substrate is a glass plate.

An embodiment provides an acoustic galvanic isolation device comprising transducers such as hereabove, respectively formed on the first and second surfaces of a substrate.

According to an embodiment, the second and third electrodes are connected according to a matrix structure.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 2 shows a device of galvanic isolation by acoustic connection according to an embodiment connected to a power switch; and FIG. 3 is a top view showing a matrix implementation of a transducer array.

DETAILED DESCRIPTION

Figure 1:
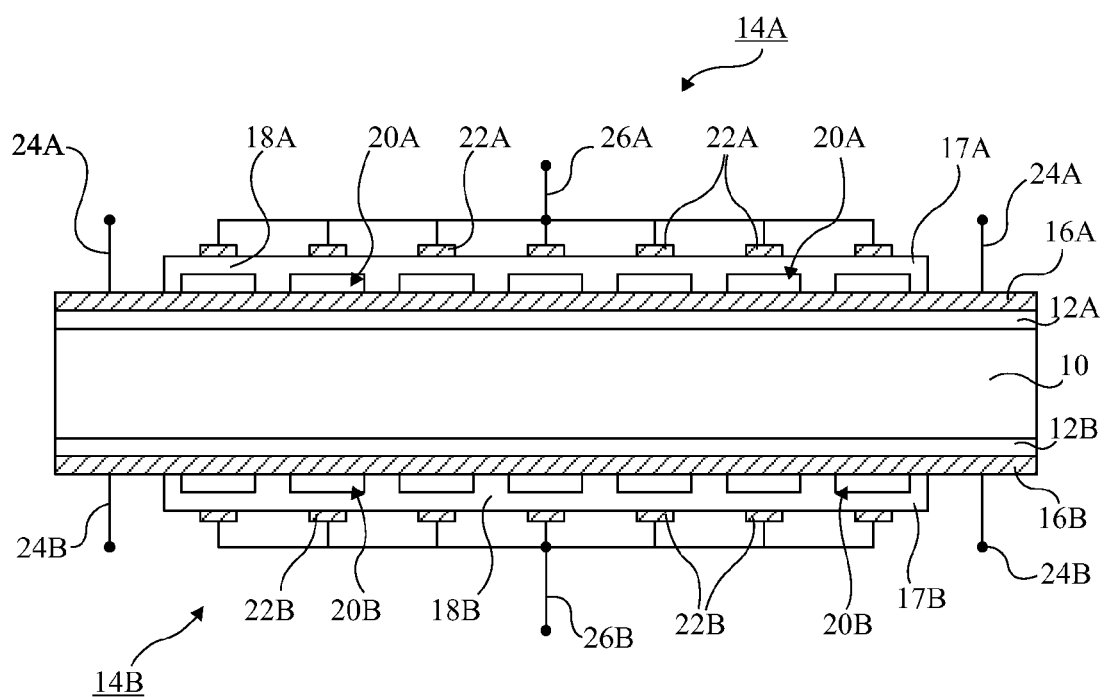
FIG. 1, previously described, shown a device of galvanic isolation by acoustic connection.

As usual in the representation of integrated circuits, the various drawings are not to scale.

FIG. 2 shows a device of galvanic isolation by acoustic connection using electroacoustic transducers integrating a capacitor.

Like the device of FIG. 1, this device comprises, symmetrically, first and second arrays 14A and 14B of ultrasonic transducers, in parallel, formed on either side of a substrate 10.

Instead of comprising a single electrode 22A/22B on each membrane 18A/18B, each of the transducers of FIG. 2 comprises a pair of electrodes 23A/23B and 28A/28B separated by an insulating layer 30A/30B. Thus, a D.C. bias voltage can be applied between electrode 16A/16B and one of electrodes 23A/23B and 28A/28B, the high-frequency signal being applied or used between electrode 16 and the other one of electrodes 23A/23B and 28A/28B.

Electrodes 23A/23B and 28A/28B thus form the two electrodes of capacitors. As previously, all electrodes 23A, as well as all electrodes 28A, 23B and 28B, are interconnected. The capacitors enable to decouple the biasing portion from the high-frequency portion and their advantage will especially appear from the following description of an application of the galvanic isolation device described herein.

In the example shown in FIG. 2, on the transmit side, a generator 34A applies a direct current (D.C.) bias voltage between electrodes 16A and 23A between contacts 24A and 32A. A microcontroller 38 controls a high-frequency source 40, which applies high-frequency voltage bursts between electrodes 16A and 28A of array 14A. On the receive side, a generator 34B biases electrodes 23B with respect to electrode 16B between contacts 24B and 32B, and a high-frequency signal resulting from the vibration of membrane 18B is received on output contact 26B connected to electrodes 28B. The high-frequency signal is applied to a gate terminal 48 of a triac or any other power switch 46. The triac belongs to a power circuit comprising a load 44 connected to an alternating current (A.C.) power source 42, for example, the mains. Thus, the conduction of the triac is determined by the high-frequency signal controlled by microcontroller 38 and this microcontroller is isolated from the triac by a galvanic isolation acoustic device.

Gate 48 of the triac or other power switch 46 is triggered by the high-frequency signal and must not be connected to a D.C. voltage. The problem of the risk for the D.C. biasing of the transducer membranes to be found on gate 48 of the triac or other power switch however remains. The capacitors described herein have the function of avoiding for D.C. voltage 34B to be present on gate 48 and to affect the operation of power switch 46.

As described previously, capacitor structures between electrodes 23A and 28A are also provided on the transmit side. Such capacitors have the additional advantage of decoupling D.C. voltage source 34A from high-frequency generator 40. They are essentially provided to ensure the symmetry of the device, which provides the advantage of simplifying its manufacturing process and its use.

The total capacitance of the parallel capacitors depends on the insulator thickness, on the surface area of the capacitors, and also on the number of capacitors. As an example, for a capacitor having an insulator 30B made of silicon nitride with a dielectric constant equal to 7.5, a 100-nm thickness, and a 400-$\mu m^2$ surface area, the capacitance of the integrated capacitor is 0.26 pF. For an acoustic galvanic isolation device having a surface area of 7×7 $mm^2$ on which are formed 35,546 transducers, each being provided with a capacitor having a 0.26-pF capacitance, the total capacitance of the parallel capacitors is 10 nF. Such a value enables to smoothly transmit the high-frequency signal (greater than 1 MHz) generated by membranes 18B of the transducers of array 14B.

FIG. 3 is a top view showing a matrix implementation of a transducer array such as described previously. For simplification, an array of 4×4 transducers only has been shown, but this array will in practice have a much larger dimension, as indicated hereabove. Above electrode 16 are arranged electrodes 23 connected to one another along columns by conductive tracks 43, all the columns of conductive tracks 43 ending at a common contact 32. Similarly, above electrodes 23, all the electrodes 28 of a same line are interconnected by conductive tracks 48 to a common contact 26. Although this is not visible in the drawing, it should be clear that first electrodes 23 are arranged above membranes 18 and that an insulating layer 30 is interposed between electrodes 23 and 28. This matrix arrangement enables to decrease stray capacitances.

Further, although FIGS. 2 and 3 have shown each electrode 28A/28B/28 as having a surface area smaller than that of the corresponding electrode 23A/23B/23, it should be noted that this has been essentially done to ease the representation and that the two electrodes may have same surface areas.

The thicknesses of the metal electrodes will be taken into account in the general thickness of membranes 18A/18B and of insulating layers 30A/30B to optimize the introduction, respectively the reception, of acoustic waves at the high-frequency signal oscillation frequency of source 40 towards, respectively from, the substrate. As an example, the thickness of the silicon nitride membrane ranges between 250 and 400 nm, the thickness of insulating layer 30A/30B being selected by those skilled in the art, for example, between 80 and 250 nm.

Specific embodiments of the present invention have been described. Various alterations and modifications will occur to those skilled in the art. In particular, the dimensions and shapes of the transducers, the dimensions of the galvanic isolation device, the thickness of the electrodes, the acoustic frequency, the frequency of the A.C. source and the D.C. bias voltage will be selected by those skilled in the art according to the desired performance.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electroacoustic transducer comprising:
    a first electrode disposed above a first surface of a substrate capable of transmitting ultrasound,
    a membrane disposed above the first electrode and separated therefrom by a cavity,
    a second electrode disposed above the membrane,
    a first insulating layer above the second electrode, and
    a third electrode disposed above the first insulating layer.

2. The electroacoustic transducer of claim 1, wherein the membrane and the first insulating layer are made of silicon nitride.

3. The electroacoustic transducer of claim 1, further comprising contacts capable of connecting a direct current voltage generator between the first electrode and the second electrode and an alternating current source between the first electrode and the third electrode.

4. The electroacoustic transducer of claim 1, further comprising a second insulating layer disposed between the first surface of the substrate and the first electrode.

5. The electroacoustic transducer of claim 1, wherein the substrate is a glass plate or a silicon wafer.

6. An acoustic galvanic isolation device comprising the electroacoustic transducer of claim 1, further comprising:
    an additional first electrode disposed below a second surface of the substrate;

an additional membrane disposed below the additional first electrode and separated therefrom by an additional cavity;

an additional second electrode disposed below the additional membrane;

an additional first insulating layer below the additional second electrode; and an additional third electrode disposed below the additional first insulating layer.

7. The acoustic galvanic isolation device of claim 6, wherein:
the second electrode and the third electrode are connected according to a matrix structure; and
the additional second electrode and the additional third electrode are connected according to the matrix structure.

8. The acoustic galvanic isolation device of claim 6, wherein the first surface of the substrate is disposed opposite to the second surface of the substrate.

9. An electroacoustic transducer comprising:
a first electrode disposed on a substrate capable of transmitting ultrasound,
a membrane disposed above the first electrode and separated therefrom by a cavity,
a second electrode disposed on the membrane,
a first insulating layer on the second electrode,
a third electrode disposed on the first insulating layer, and
contacts configured to connect a direct current voltage generator between the first electrode and the second electrode and an alternating current source between the first electrode and the third electrode.

10. The electroacoustic transducer of claim 9, wherein the membrane and the first insulating layer are made of silicon nitride.

11. The electroacoustic transducer of claim 9, further comprising a second insulating layer disposed between the first surface of the substrate and the first electrode.

12. The electroacoustic transducer of claim 9, wherein the substrate is a glass plate or a silicon wafer.

13. An acoustic galvanic isolation device comprising the electroacoustic transducer of claim 9, further comprising:
an additional first electrode disposed below a second surface of the substrate;
an additional membrane disposed below the additional first electrode and separated therefrom by an additional cavity;
an additional second electrode disposed below the additional membrane;
an additional first insulating layer below the additional second electrode;
an additional third electrode disposed below the additional first insulating layer; and
additional contacts configured to connect an additional direct current voltage generator between the additional first electrode and the additional second electrode and a circuit between the additional first electrode and the additional third electrode.

14. The acoustic galvanic isolation device of claim 13, wherein:
the second electrode and the third electrode are connected according to a matrix structure; and
the additional second electrode and the additional third electrode are connected according to the matrix structure.

15. The acoustic galvanic isolation device of claim 13, wherein the first surface of the substrate is disposed opposite to the second surface of the substrate.

16. The acoustic galvanic isolation device of claim 13, wherein the circuit comprises:
a switch with a gate;
a load; and
an additional alternating current source.

17. An apparatus comprising:
a first electrode disposed above a first surface of a substrate;
a membrane disposed above the first electrode and separated from the first electrode by a cavity;
a second electrode disposed above the membrane;
a first insulating layer disposed above the second electrode; and
a third electrode disposed above the first insulating layer.

18. The electroacoustic transducer of claim 17, wherein the membrane and the first insulating layer are made of silicon nitride.

19. The electroacoustic transducer of claim 17, further comprising contacts capable of connecting a direct current voltage generator between the first electrode and the second electrode and an alternating current source between the first electrode and the third electrode.

20. The electroacoustic transducer of claim 17, further comprising a second insulating layer disposed between the first surface of the substrate and the first electrode.

21. The electroacoustic transducer of claim 17, wherein the substrate is a glass plate or a silicon wafer.

22. An acoustic galvanic isolation device comprising the electroacoustic transducer of claim 17, further comprising:
an additional first electrode disposed below a second surface of the substrate,
an additional membrane disposed below the additional first electrode and separated therefrom by an additional cavity,
an additional second electrode disposed below the additional membrane,
an additional first insulating layer below the additional second electrode, and
an additional third electrode disposed below the additional first insulating layer.

23. The acoustic galvanic isolation device of claim 22, wherein:
the second electrode and the third electrode are connected according to a matrix structure; and
the additional second electrode and the additional third electrode are connected according to the matrix structure.

24. The acoustic galvanic isolation device of claim 22, wherein the first surface of the substrate is disposed opposite to the second surface of the substrate.

25. An apparatus comprising:
a first electrode disposed above a first surface of a substrate;
a membrane disposed above the first electrode and separated from the first electrode by a cavity;
a second electrode disposed above the membrane;
a first insulating layer disposed above the second electrode;
a third electrode disposed above the first insulating layer; and
contacts configured to connect:
a biasing voltage between the first electrode and the second electrode; and
an input and/or output voltage between the first electrode and the third electrode.

26. The electroacoustic transducer of claim 25, wherein the membrane and the first insulating layer are made of silicon nitride.

27. The electroacoustic transducer of claim 25, wherein:
the biasing voltage comprises a direct current voltage generator; and
the input and/or output voltage comprises an alternating current source.

28. The electroacoustic transducer of claim 25, further comprising a second insulating layer disposed between the first surface of the substrate and the first electrode.

29. The electroacoustic transducer of claim 25, wherein the substrate is a glass plate or a silicon wafer.

30. An acoustic galvanic isolation device comprising the electroacoustic transducer of claim 25, further comprising:
an additional first electrode disposed below a second surface of the substrate;
an additional membrane disposed below the additional first electrode and separated therefrom by an additional cavity;
an additional second electrode disposed below the additional membrane;
an additional first insulating layer below the additional second electrode;
an additional third electrode disposed below the additional first insulating layer; and
additional contacts configured to connect:
an additional biasing voltage between the additional first electrode and the additional second electrode; and
an additional input and/or output voltage between the additional first electrode and the additional third electrode.

31. The acoustic galvanic isolation device of claim 30, wherein:
the second electrode and the third electrode are connected according to a matrix structure; and
the additional second electrode and the additional third electrode are connected according to the matrix structure.

32. The acoustic galvanic isolation device of claim 30, wherein the first surface of the substrate is disposed opposite to the second surface of the substrate.

33. The acoustic galvanic isolation device of claim 30, wherein:
the additional biasing voltage comprises an additional direct current voltage generator; and
the additional input and/or output voltage comprises a circuit.

34. The acoustic galvanic isolation device of claim 33, wherein the circuit comprises:
a switch with a gate;
a load; and
an additional alternating current source.

* * * * *